United States Patent
Jang et al.

(10) Patent No.: US 9,230,998 B2
(45) Date of Patent: Jan. 5, 2016

(54) THIN FILM TRANSISTOR SUBSTRATE AND LIQUID CRYSTAL DISPLAY DEVICE USING THE SAME

(71) Applicant: LG Display Co., Ltd., Seoul (KR)

(72) Inventors: Hun Jang, Paju-si (KR); Sul Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/548,130

(22) Filed: Nov. 19, 2014

(65) Prior Publication Data
US 2015/0187805 A1 Jul. 2, 2015

(30) Foreign Application Priority Data
Dec. 30, 2013 (KR) .......................... 10-2013-0166568

(51) Int. Cl.
| | | |
|---|---|---|
| H01L 27/12 | (2006.01) | |
| H01L 29/786 | (2006.01) | |
| G02F 1/1362 | (2006.01) | |
| G02F 1/1368 | (2006.01) | |

(52) U.S. Cl.
CPC ............ *H01L 27/124* (2013.01); *G02F 1/1368* (2013.01); *G02F 1/136286* (2013.01); *H01L 29/786* (2013.01)

(58) Field of Classification Search
CPC ................ H01L 27/124; H01L 29/786; G02F 1/136286; G02F 1/1368
See application file for complete search history.

(56) References Cited

U.S. PATENT DOCUMENTS

| | | | |
|---|---|---|---|
| 9,064,463 B2 * | 6/2015 | Jung ...................... | G09G 3/348 |
| 2007/0122649 A1 * | 5/2007 | Lee ........................ | H01L 29/458 |
| | | | 428/674 |
| 2014/0036193 A1 * | 2/2014 | Jeong ................ | G02F 1/133555 |
| | | | 349/46 |
| 2015/0206818 A1 * | 7/2015 | Choi ................... | H01L 23/3171 |
| | | | 349/46 |

* cited by examiner

*Primary Examiner* — Long Pham
(74) *Attorney, Agent, or Firm* — Fenwick & West LLP

(57) ABSTRACT

A thin film transistor substrate and a liquid crystal display device are disclosed. The thin film transistor substrate comprises gate lines arranged on a substrate in a first direction and sub gate lines connected with the gate lines; data lines arranged on the substrate in a second direction to define a pixel including a first pixel and a second pixel, together with the gate lines; a semiconductor layer formed overlapping with each of the gate lines, the sub gate lines and the data lines and connected with the date lines; and a pixel electrode connected with the semiconductor layer. An aperture ratio may be improved at high resolution.

20 Claims, 6 Drawing Sheets

THIN FILM TRANSISTOR SUBSTRATE AND LIQUID CRYSTAL DISPLAY DEVICE USING THE SAME

CROSS REFERENCE TO RELATED APPLICATIONS

This application claims the benefit of the Korean Patent Application No. 10-2013-0166568 filed on Dec. 30, 2013, which is hereby incorporated by reference for all purposes as if fully set forth herein.

BACKGROUND OF THE INVENTION

1. Field of the Invention

The present invention relates to a thin film transistor substrate, and more particularly, to a thin film transistor substrate enabling high resolution of display device.

2. Discussion of the Related Art

A thin film transistor has been widely used as a switching element of a display device such as a liquid crystal display device or an organic light emitting display device.

The thin film transistor includes a gate electrode, a semiconductor layer, a source electrode, and a drain electrode. Hereinafter, a thin film transistor substrate of the related art will be described with reference to the accompanying drawing.

FIG. 1 is a brief plane view illustrating a thin film transistor substrate of the related art.

As shown in FIG. 1, the thin film transistor substrate of the related art includes a gate line 10, a gate electrode 12, a data line 20, a source electrode 22, a drain electrode 24, a semiconductor layer 30, and a pixel electrode 40.

The gate line 10 is arranged in a horizontal direction, and the gate electrode 12 is extended from the gate line 10.

The data line 20 is arranged in a vertical direction to cross the gate line 10. A pixel region is defined by a crossing between the gate line 10 and the data line 20.

The source electrode 22 is extended from the data line 20, and the drain electrode 24 is spaced apart from the source electrode 22, facing the source electrode 22.

The semiconductor layer 30 is formed to overlap the gate electrode 12, the source electrode 22, and the drain electrode 24.

The pixel electrode 40 is formed in the pixel region defined by the gate line 10 and the data line 20. The pixel electrode 40 is connected with the drain electrode 24 through a contact hole.

The aforementioned thin film transistor substrate of the related art is used for a display device such as a liquid crystal display device, and has limitation in application for a recent display device of high resolution.

In the display device of high resolution, as the number of pixels is increased, the number of thin film transistors is also increased. If the structure of the thin film transistor according to the related art is applied to the display device of high resolution, a problem occurs in that an aperture ratio is reduced.

SUMMARY OF THE INVENTION

Accordingly, the present invention is directed to a thin film transistor substrate and a liquid crystal display device using the same, which substantially alleviates one or more problems of the related art.

An advantage of the present invention is to provide a thin film transistor substrate of which the aperture ratio is improved to be applied to a display device of high resolution, and a liquid crystal display device using the same.

Additional advantages and features of the invention will be set forth in part in the description which follows and in part will become apparent to those having ordinary skill in the art upon examination of the following. The objectives and other advantages of the various embodiments may be realized and attained by the structure particularly pointed out in the written description and claims hereof as well as the appended drawings.

To achieve these objects and other advantages, as embodied and broadly described herein, a thin film transistor substrate comprises gate lines arranged on a substrate in a first direction and sub gate lines connected with the gate lines; data lines arranged on the substrate in a second direction to define a pixel including a first pixel and a second pixel, together with the gate lines; a semiconductor layer formed overlapping with each of the gate lines, the sub gate lines and the data lines and connected with the date lines; and a pixel electrode connected with the semiconductor layer.

In another aspect of the present invention, a liquid crystal display device comprises a thin film transistor substrate; an opposite substrate; and a liquid crystal layer formed between these substrates, wherein the thin film transistor substrate comprises gate lines arranged on a substrate in a first direction and sub gate lines connected with the gate lines; data lines arranged on the substrate in a second direction to define a pixel including a first pixel and a second pixel, together with the gate lines; a semiconductor layer formed overlapping with each of the gate lines, the sub gate lines and the data lines and connected with the date lines; and a pixel electrode connected with the semiconductor layer.

BRIEF DESCRIPTION OF THE DRAWINGS

The accompanying drawings, which are included to provide a further understanding of the various embodiments and are incorporated in and constitute a part of this application, illustrate the various embodiments and together with the description serve to explain the principle of the various embodiments. In the drawings.

DETAILED DESCRIPTION OF THE INVENTION

Reference will now be made in detail to the exemplary embodiments, examples of which are illustrated in the accompanying drawings. Wherever possible, the same reference numbers will be used throughout the drawings to refer to the same or like parts.

The terminology "on" disclosed in this specification includes the disclosure that an element is formed on a surface of another element and also includes the disclosure that a third element is interposed between the above elements.

The terminologies such as "first" and "second" disclosed in this specification are not intended to mean the order of corresponding elements but intended to identify one element from another element.

Hereinafter, various embodiments will be described in detail with reference to the accompanying drawings.

Figure 1:
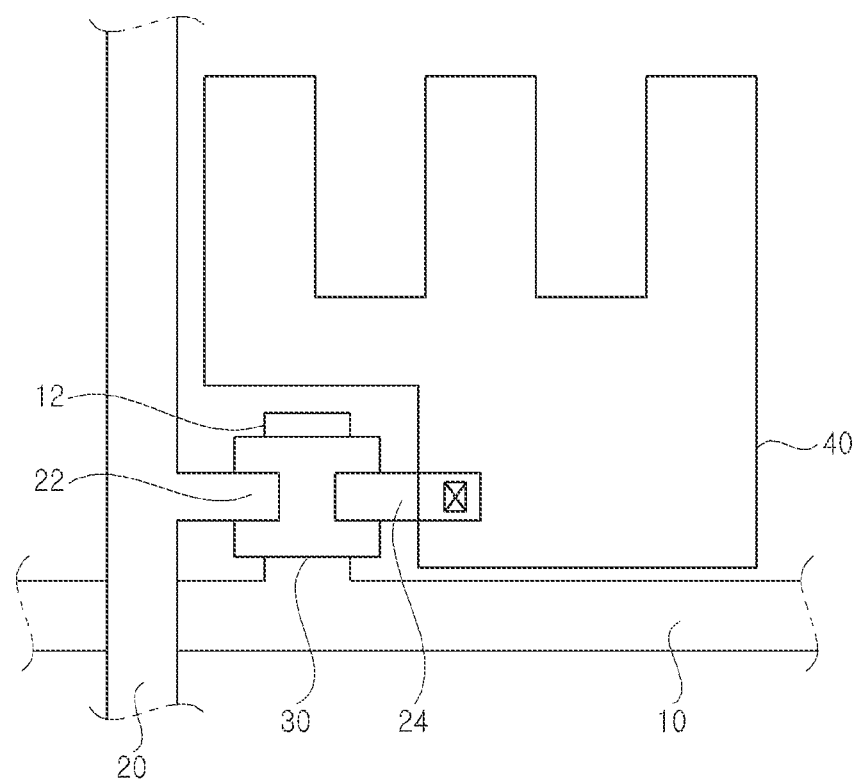
FIG. 1 is a top view illustrating a thin film transistor substrate of the related art.
Figure 2:
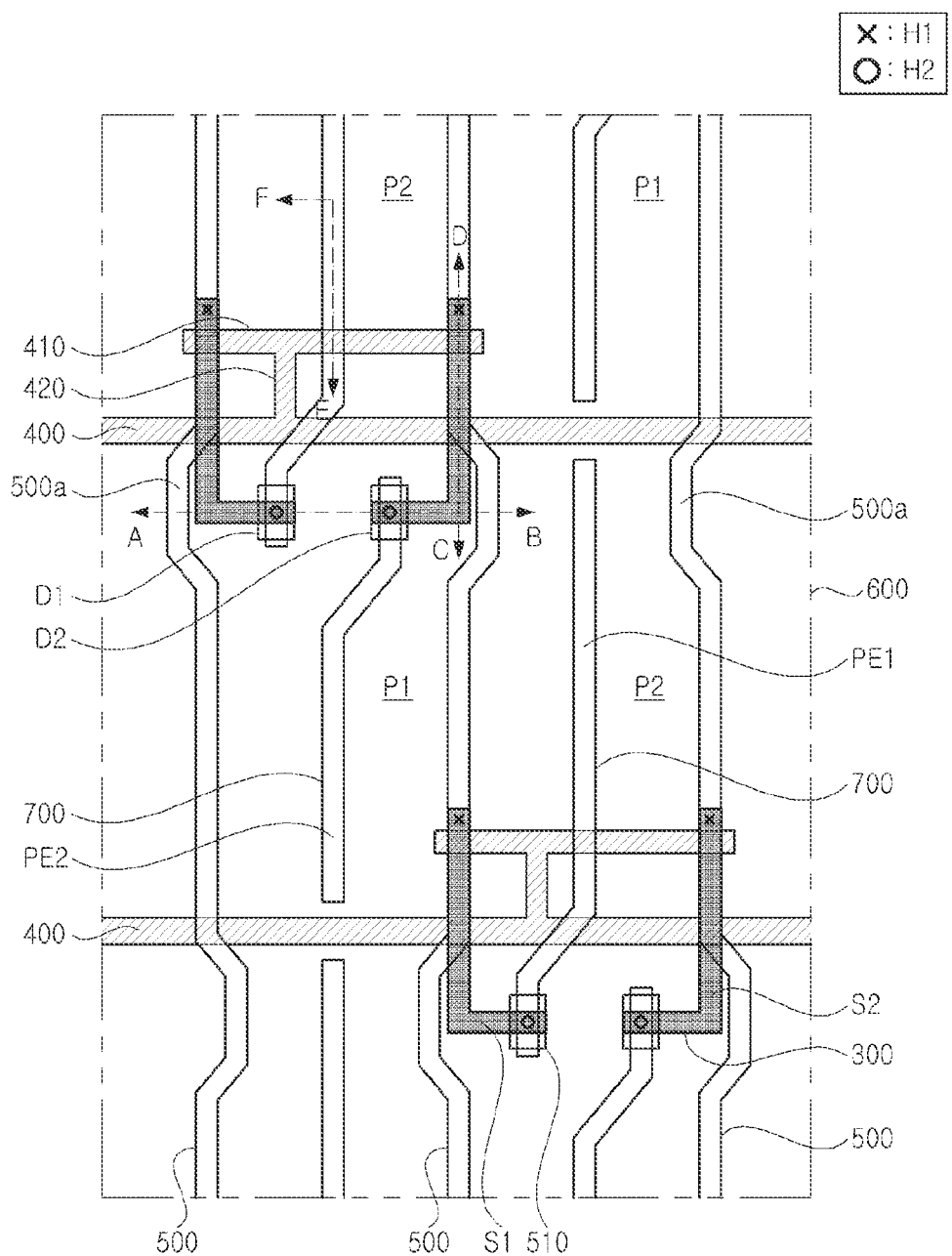
FIG. 2 is a top view illustrating a thin film transistor substrate according to one embodiment.

FIG. 2 is a top view illustrating a thin film transistor substrate according to one embodiment.

As shown in FIG. 2, the thin film transistor substrate according to one embodiment includes gate lines 400, data lines 500, a drain electrode 510, a semiconductor layer 300, a common electrode 600, and a pixel electrode 700.

The gate lines 400 are arranged in a first direction, for example, horizontal direction. The plurality of gate lines 400 are spaced apart from one another along a plurality of rows.

Each of the gate lines 400 is connected with a sub gate line 410 through a bridge line 420. Accordingly, the same gate voltage is applied to the gate lines 400 and the sub gate lines 410. The gate line 400, the sub gate line 410 and the bridge line 420 may be formed of the same material at the same time. In other words, the gate line 400, the sub gate line 410 and the bridge line 420 may be formed in one body.

The sub gate line 410 is extended from one side of the gate line 400, for example, an upper side of the gate line 400 in parallel with the gate line 400. The sub gate line 410 is formed to overlap with the data line 500 of one side (for example, left side) constituting one pixel and the data line 500 of the other side (for example, right side), but the sub gate line 410 does not overlap with the data line 500 of another pixel adjacent to the one pixel.

The bridge line 420 connects the gate line 400 with the sub gate line 410. Accordingly, the bridge line 420 is formed between the gate line 400 and the sub gate line 410, and various modifications may be made in the location of the bridge line 420. However, the bridge line 420 is preferably formed within one pixel.

The data line 500 is arranged in a second direction, for example, vertical direction, to cross the gate line 400. Each pixel is defined by the gate line and the data line, which cross each other. The plurality of data lines 500 are spaced apart from one another along a plurality of columns.

The data line 500 may include a bent portion 500a for each pixel. The bent portion 500a is bent towards an outer side of a first pixel P1 on the basis of the first pixel P1, and is bent towards an inner side of a second pixel P2 on the basis of the second pixel P2 adjacent to the first pixel P1. Accordingly, the area of the first pixel P1 becomes greater than the area of the second pixel P2 by the bent portion 500a. However, an opening area of the second pixel P2 of which area is relatively small, becomes greater than the opening of the first pixel P1 of which the area is relatively large. The opening area means an area where light is to be transmitted.

The bent portion 500a of the data line 500 may be formed such that its end is overlapped with the gate line 400.

The data line 500 may be formed in a straight line structure without the bent portion 500a.

The drain electrode 510 is formed within each pixel. The drain electrode 510 is formed in an island structure. The drain electrode 510 may be of the same material as that of the data line 500, and formed simultaneously with the data line 500.

The drain electrode 510 includes a first drain electrode D1 and a second drain electrode D2, which are formed within one pixel. The first drain electrode D1 and the second drain electrode D2 are spaced apart from each other. The first and second drain electrodes D1 and D2 are formed in a region facing the bent portion 500a of the data line 500.

Although the drain electrode 510 is formed in a first pixel P1, the drain electrode 510 is not formed within a second pixel P2 adjacent to the first pixel P1. The drain electrode 510 becomes a non-opening area where light is not transmitted. Accordingly, as described above, although the area of the second pixel P2 is smaller than that of the first pixel P1, since the drain electrode 510 is not formed in the second pixel P2 and is formed in the first pixel P1, the opening area of the second pixel P2 becomes greater than that of the first pixel P1.

The semiconductor layer 300 is formed in a region where the gate line 400 crosses the data line 500. Particularly, the semiconductor layer 300 is formed to be overlapped with the gate line 400, the sub gate line 410, the data line 500 and the drain electrode 510. The gate line 400 and the sub gate line 410, which are overlapped with the semiconductor layer 300, serve as the gate electrodes, and the data line 500 which is overlapped with the semiconductor layer 300 serves as the source electrode. Accordingly, the thin film transistor is formed by combination of the semiconductor layer 300, the gate line 400, the sub gate line 410, the data line 500 and the drain electrode 510.

According to one embodiment, since the gate line 400 and the sub gate line 410, to which the same gate voltage is applied, serve as the gate electrodes of one thin film transistor, it is advantageous in that one thin film transistor are provided with two gate electrodes.

A mark (X) in the drawing represents a first contact hole H1 where the semiconductor layer 300 is connected with the data line 500. In other words, the semiconductor layer 300 is directly connected with the data line 500 through the first contact hole H1.

A mark (○) in the drawing represents a second contact hole H2 where the semiconductor layer 300, the drain electrode 510 and the pixel electrode 700 are connected with one another. In other words, the semiconductor layer 300 is directly connected with the drain electrode 510 and the pixel electrode 700 through the second contact hole H2. One end of the semiconductor layer 300 and one end of the pixel electrode, which are connected with the drain electrode 510, are formed in the region facing the bent portion 500a of the data line 500 in the same manner as the drain electrode 510.

The semiconductor layer 300 includes a first semiconductor layer S1 and a second semiconductor layer S2, which are formed within one pixel. The first semiconductor layer S1 and the second semiconductor layer S2 are spaced apart from each other.

The first semiconductor layer S1 is formed overlapping the gate line 400, the data line 500 of a first side of pixels P1 and P2, a first end of the sub gate line 410, and the first drain electrode D1. Also, the second semiconductor layer S2 is formed overlapping the gate line 400, the data line 500 of a second side of pixels P1 and P2, a second end of the sub gate line 410, and the second drain electrode D2.

Accordingly, one thin film transistor is formed by combination of the first semiconductor layer S1, the gate line 400, the data line 500 of the first side of the pixels P1 and P2, the first end of the sub gate line 410, and the first drain electrode D1; and another thin film transistor is formed by combination of the second semiconductor layer S2, the gate line 400, the data line 500 of the second side of the pixels P1 and P2, the second end of the sub gate line 410, and the second drain electrode D2. These two thin film transistors are formed in the first pixel P1 and the second pixel P2, adjacent to each other.

Accordingly, an aperture ratio between the first pixel P1 and the second pixel P2 is improved even for display device of high resolution.

The common electrode 600 may adjust an arrangement direction of the liquid crystal layer by forming an electric field together with the pixel electrode 700. Particularly, according to one embodiment, a fringe field may be formed between the common electrode 600 and the pixel electrode 700, where the arrangement direction of the liquid crystal layer may be adjusted.

In order to form the fringe field, the common electrode 600 may be formed in an entire display region where picture image is displayed, in a plate structure.

If the common electrode 600 is formed below the pixel electrode 700, an open hole is formed in the common electrode 600 to prevent short with the pixel electrode 700 from occurring in the second contact hole H2.

The pixel electrode 700 is formed for each pixel. The pixel electrode 700 includes a first pixel electrode PE1 and a second pixel electrode PE2.

The first pixel electrode PE1 is connected with the first drain electrode D1 through the second contact hole H2 marked with (○), and is extended from the first pixel P1 to the second pixel P2.

The second pixel electrode PE2 is connected with the second drain electrode D2 through the second contact hole H2 marked with (○), and is extended within the first pixel P 1.

In other words, the first drain electrode D1 and the second drain electrode D2, which are formed in the first pixel P1, are connected with the first pixel electrode PE1 and the second pixel electrode PE2, respectively, wherein the first pixel electrode PE1 is extended to the second pixel P2, and the second pixel electrode PE2 is extended within the first pixel P1.

Figure 3:
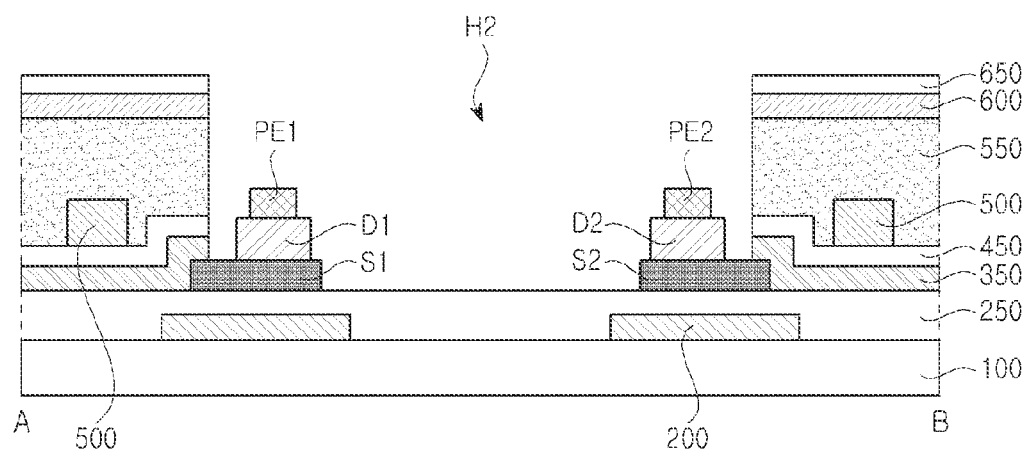
FIG. 3 is a cross-sectional view illustrating a thin film transistor substrate according to one embodiment of the present invention, and corresponds to a section taken along line A-B of FIG. 2.

FIG. 3 is a cross-sectional view illustrating a thin film transistor substrate according to one embodiment, and corresponds to a section taken along line A-B of FIG. 2. FIG. 3 corresponds to a cross-section of a thin film transistor area.

As shown in FIG. 3, the thin film transistor substrate according to one embodiment of the present invention includes a substrate 100, a light-shielding layer 200, a buffer layer 250, first and second semiconductor layers S1 and S2, gate insulating film 350, interlayer insulating film 450, data lines 500, first and second drain electrode D1 and D2, first passivation film 550, common electrode 600, second passivation film 650, and first and second pixel electrodes PE1 and PE2.

The substrate 100 may be made of glass or transparent plastic.

The light-shielding layer 200 is formed on the substrate 100. The light-shielding layer 200 prevents light incident from the lower portion of the substrate 100 from adversely affecting the first and second semiconductor layers S1 and S2. Accordingly, the light-shielding layer 200 is formed to be overlapping with the first and second semiconductor layers S1 and S2.

The buffer layer 250 is formed on the light-shielding layer 200. The buffer layer 250 shields impurities included in the substrate 100 from being permeated into the semiconductor layer 300 during high-temperature processes. Buffer layer 250 may be made of an insulting material.

The first and second semiconductor layers S1 and S2 are formed on the buffer layer 250. The first and second semiconductor layers S1 and S2 are formed to be overlapping with the light-shielding layer 200. The first and second semiconductor layers S1 and S2 may be made of a silicon based semiconductor material or oxide semiconductor material.

The gate insulating film 350 is formed on the first and second semiconductor layers S1 and S2. The gate insulating film 350 may be made of an inorganic insulating material.

The interlayer insulating film 450 is formed on the gate insulating film 350 to insulate a gate line (not shown) from a data line 500. The interlayer insulating film 450 may be made of an inorganic insulating material.

The data line 500 is formed on the interlayer insulating film 450. The data line 500 may be made of Mo, Al, Cr, Au, Ti, Ni, Nd, Cu or their alloy, or may be made of a single layer of the above metals or alloy, or two or more multiple layers.

The first passivation film 550 is formed on the data line 500. The first passivation film 550 may be made of an organic insulating material such as photo acryl. The first passivation film 550 may be planarized.

The common electrode 600 is formed on the first passivation film 550. The common electrode 600 is formed with an open hole in the second contact hole H2 for connection between the first/second pixel electrodes PE1 and PE2 and the semiconductor layer 300. The common electrode 600 is made of a transparent conductive material such as indium-tin-oxide (ITO).

The second passivation film 650 is formed on the common electrode 600. The second passivation film 650 may be made of an inorganic insulating material.

The first and second drain electrodes D1 and D2 are formed on the first and second semiconductor layers S1 and S2 in the second contact hole H2 region. The first drain electrode D1 is directly connected with the first semiconductor layer S1 in the second contact hole H2 region, and the second drain electrode D2 is directly connected with the second semiconductor layer S2 in the second contact hole H2 region.

The first and second pixel electrodes PE1 and PE2 are formed on the first and second drain electrodes D1 and D2 in the second contact hole H2 region. The first pixel electrode PE1 is directly connected with the first drain electrode D1 in the second contact hole H2 region, and the second pixel electrode PE2 is directly connected with the second drain electrode D2 in the second contact hole H2 region. The pixel electrodes 700 are made of a transparent conductive material such as ITO.

For connection among the first and second semiconductor layers S1 and S2, the first and second drain electrodes D1 and D2, and the first and second pixel electrodes PE1 and PE2, predetermined regions of the gate insulating film 350, the interlayer insulating film 450, the first passivation film 550, and the second passivation film 650 are removed from the second contact hole H2 region.

Figure 4:
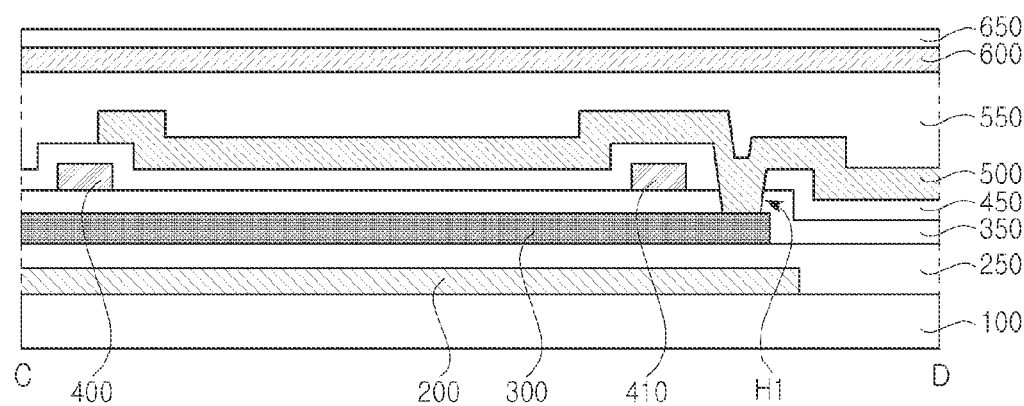
FIG. 4 is a cross-sectional view illustrating a thin film transistor substrate according to one embodiment, and corresponds to a section taken along line C-D of FIG. 2.

FIG. 4 is a cross-sectional view illustrating a thin film transistor substrate according to one embodiment, and corresponds to a section taken along line C-D of FIG. 2. FIG. 4 corresponds to a section of a region where the semiconductor layer 300 is overlapped with the data line 500.

As shown in FIG. 4, the thin film transistor substrate according to one embodiment includes a substrate 100, light-shielding layer 200, buffer layer 250, semiconductor layer 300, gate insulating film 350, gate line 400, sub gate line 410, interlayer insulating film 450, data line 500, first passivation film 550, common electrode 600, and second passivation film 650. Detailed description of the same elements as those described above with respect to FIG. 3 will be omitted.

The light-shielding layer 200 is formed on the substrate 100. The light-shielding layer 200 is formed to be overlapping with the semiconductor layer 300.

The buffer layer 250 is formed on the light-shielding layer 200, and the semiconductor layer 300 is formed on the buffer layer 250. The semiconductor layer 300 is formed to be overlapping with the light-shielding layer 200.

The gate insulating film 350 is formed on the semiconductor layer 300 to insulate the semiconductor layer 300 from the gate line 400 and the sub gate line 410.

The gate line 400 and the sub gate line 410 are formed on the gate insulating film 350. The gate line 400 and the sub gate line 410 are formed to be overlapping with the semiconductor layer 300 to activate the semiconductor layer 300 when a gate voltage is applied to the gate line 400 and the sub gate line 410. The gate line 400 and the sub gate line 410 may be made of Mo, Al, Cr, Au, Ti, Ni, Nd, Cu or their alloy, or may be made of a single layer of the above metals or alloy, or two or more multiple layers.

The interlayer insulating film 450 is formed on the gate line 400 and the sub gate line 410.

The data line 500 is formed on the interlayer insulating film 450. The data line 500 is directly connected with the semiconductor layer 300 through the first contact hole H1. The first contact hole H1 is formed by removing predetermined regions of the gate insulating film 350 and the interlayer insulating film 450, whereby a predetermined region of the semiconductor layer 300 is exposed by the first contact hole H1.

The first passivation film 550 is formed on the data line 500, the common electrode 600 is formed on the first passivation film 550, and the second passivation film 650 is formed on the common electrode 600.

Figure 5:
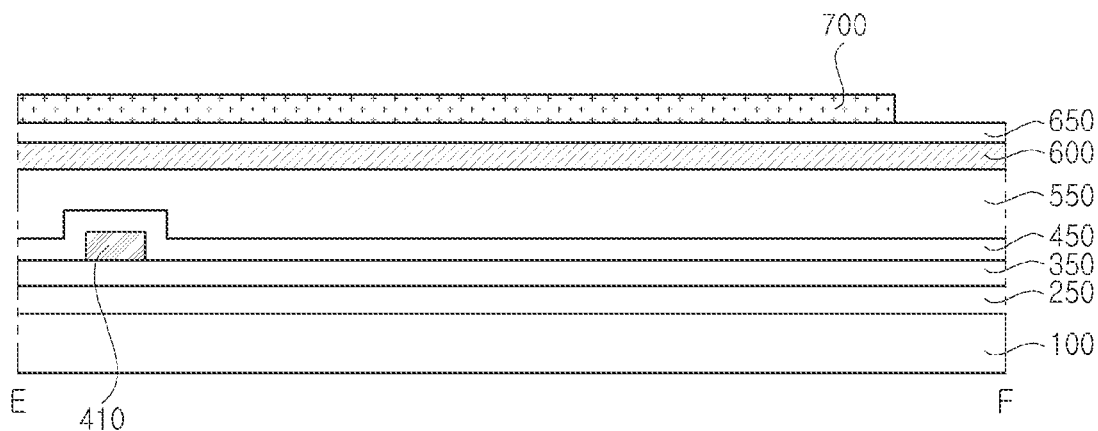
FIG. 5 is a cross-sectional view illustrating a thin film transistor substrate according to one embodiment, and corresponds to a section taken along line E-F of FIG. 2.

FIG. 5 is a cross-sectional view illustrating a thin film transistor substrate according to one embodiment, and corresponds to a section taken along line E-F of FIG. 2. FIG. 5 corresponds to a section of a pixel region.

As shown in FIG. 5, the buffer layer 250 is formed on the substrate 100, the gate insulating film 350 is formed on the buffer layer 250, and the sub gate line 410 is formed on the gate insulating film 350.

The interlayer insulating film 450 is formed on the sub gate line 410, and the first passivation film 550 is formed on the interlayer insulating film 450.

The common electrode 600 is formed on the first passivation film 550, the second passivation film 650 is formed on the common electrode 600, and the pixel electrode 700 is formed on the second passivation film 650.

Although a top gate structure in which the gate line 400 is formed above the semiconductor layer 300 has been described as above, the present invention is not limited to the top gate structure and includes a bottom gate structure in which the gate line 400 is formed below the semiconductor layer 300.

Figure 6:
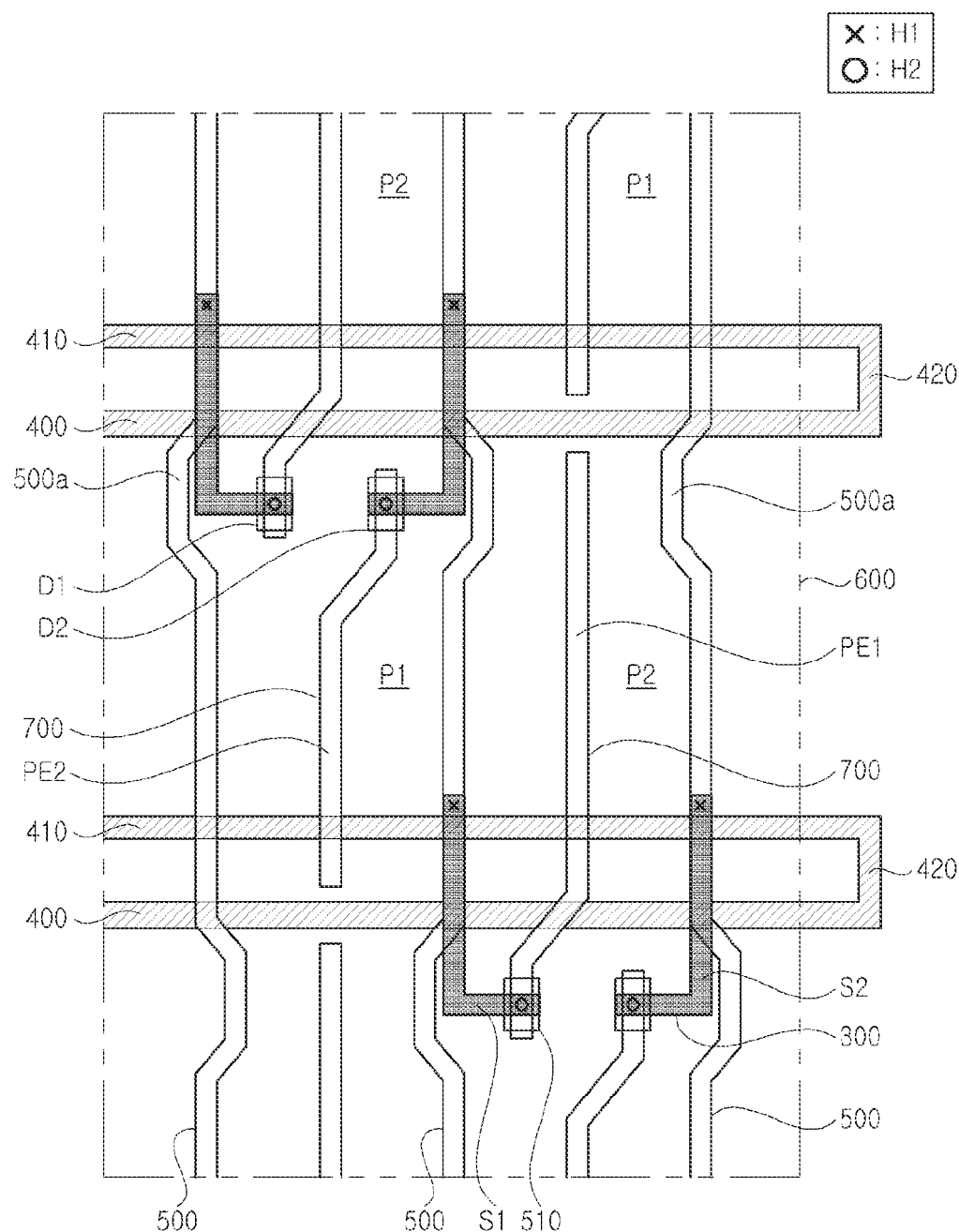
FIG. 6 is a top view illustrating a thin film transistor substrate according to another embodiment.

FIG. 6 is a top view illustrating a thin film transistor substrate according to another embodiment. FIG. 6 illustrates a thin film transistor substrate similar to the thin film transistor illustrated in FIG. 2 but with different sub gate line 410 and the bridge line 420 structures. Accordingly, the same reference numerals will be given for the same elements, and different elements will be described hereinafter.

As shown in FIG. 6, the gate lines 400 are arranged in a first direction, for example, horizontal direction, and the sub gate lines 410 are arranged in parallel with the gate line 400. The gate lines 400 are connected with the sub gate lines 410 through the bridge lines 420.

The sub gate lines 410 are formed to be respectively overlapping with a plurality of data lines 500. In other words, the gate lines 400 and the sub gate lines 410 are extended in parallel to face with each other within a display region that displays picture images.

The bridge lines 420 are formed in a non-display region outside the display region that displays picture images.

Figure 7:
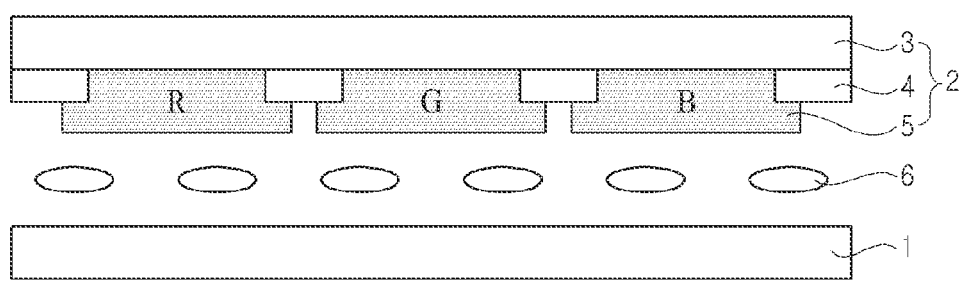
FIG. 7 is a view illustrating a liquid crystal display device according to one embodiment.

FIG. 7 is a cross-sectional view illustrating a liquid crystal display device according to one embodiment.

As shown in FIG. 7, the liquid crystal display device according to one embodiment includes a thin film transistor substrate 1, an opposite substrate 2, and liquid crystal layer 6 formed between substrates 1 and 2.

The thin film transistor substrate according to the aforementioned various embodiments is used as the thin film transistor substrate 1.

The opposite substrate 2 includes a substrate 3, a black matrix 4, and a color filter 5.

The black matrix 4 is formed on a lower surface of the substrate 3, and is patterned to correspond to a non-opening of the aforementioned thin film transistor substrate.

The color filter 5 is formed in a region between the black matrices 4, and includes a red (R) color filter, a green (G) color filter, and a blue (B) color filter.

FIG. 7 relates to the liquid crystal display device according to one embodiment, and the present invention is not limited to the structure of FIG. 7 and various modifications known in the art may be made in the present invention. For example, the color filter 5 may be formed on the thin film transistor substrate 1.

It will be apparent to those skilled in the art that various modifications and variations can be made without departing from the spirit or scope of the inventions. Thus, it is intended that the present invention covers the modifications and variations of this invention provided they come within the scope of the appended claims and their equivalents.

What is claimed is:

1. A thin film transistor substrate comprising:
gate lines arranged on a substrate in a first direction and sub gate lines connected with the gate lines;
data lines arranged on the substrate in a second direction to define a pixel including a first pixel and a second pixel, together with the gate lines;
a semiconductor layer formed overlapping with each of the gate lines, the sub gate lines and the data lines and connected with the data lines; and
a pixel electrode connected with the semiconductor layer.

2. The thin film transistor substrate of claim 1, wherein the gate lines are connected with the sub gate lines by bridge lines formed within the pixel.

3. The thin film transistor substrate of claim 1, wherein the gate lines are connected with the sub gate lines by bridge lines formed in a non-display region outside of a display region that displays picture images.

4. The thin film transistor substrate of claim 1, wherein the data lines include a bent portion, and one end of the pixel electrode is formed in a region facing the bent portion.

5. The thin film transistor substrate of claim 1, wherein the semiconductor layer is directly connected with the data lines, and is connected with the pixel electrode through a drain electrode of an island structure.

6. The thin film transistor substrate of claim 5, wherein the drain electrode is formed in the first pixel but is not formed in the second pixel.

7. The thin film transistor substrate of claim 1, wherein the semiconductor layer includes a first semiconductor layer connected with the data lines arranged at one side of the pixel, and a second semiconductor layer connected with the data lines arranged at another side of the pixel, the pixel electrode includes a first pixel electrode connected with the first semiconductor layer and a second pixel electrode connected with the second semiconductor layer, and the first pixel electrode is extended from the first pixel to the second pixel and the second pixel electrode is extended within the first pixel.

8. The thin film transistor substrate of claim 1, further comprising a common electrode additionally formed below the pixel electrode to form a fringe field together with the pixel electrode.

9. The thin film transistor substrate of claim 1, wherein the first pixel has an area greater than an area of the second pixel, and an opening area of the first pixel is smaller than an opening of the second pixel.

10. A liquid crystal display device comprising:
a thin film transistor substrate;
an opposite substrate; and
a liquid crystal layer formed between these substrates,
wherein the thin film transistor substrate comprises:
gate lines arranged on a substrate in a first direction and sub gate lines connected with the gate lines;
data lines arranged on the substrate in a second direction to define a pixel including a first pixel and a second pixel, together with the gate lines;
a semiconductor layer formed overlapping with each of the gate lines, the sub gate lines and the data lines and connected with the date lines; and
a pixel electrode connected with the semiconductor layer.

11. The thin film transistor substrate of claim 1, wherein the gate lines are connected with the sub gate lines by bridge lines.

12. The thin film transistor substrate of claim 11, wherein the gate lines, the sub gate lines, and the bridge lines are formed in one body.

13. The thin film transistor substrate of claim 1, wherein the data lines include a bent portion, and the bent portion is bent towards an outer side of the first pixel and towards an inner side of the second pixel adjacent to the first pixel so that the area of the first pixel becomes greater than the area of the second pixel.

14. The thin film transistor substrate of claim 13, wherein the drain electrode is formed in the first pixel but is not formed in the second pixel so that an opening area of the first pixel is smaller than an opening of the second pixel.

15. The thin film transistor substrate of claim 1, wherein the pixel electrode comprises a first pixel electrode in the first pixel and a second pixel electrode in the second pixel, the first pixel electrode is connected with a first drain electrode and the second pixel electrode is connected with a second drain electrode, and the first drain electrode and the second drain electrode is provided in the same first pixel.

16. The liquid crystal display device of claim 10, wherein the gate lines are connected with the sub gate lines by bridge lines.

17. The liquid crystal display device of claim 16, wherein the gate lines, the sub gate lines, and the bridge lines are formed in one body.

18. The liquid crystal display device of claim 10, wherein the data lines include a bent portion, and the bent portion is bent towards an outer side of the first pixel and towards an inner side of the second pixel adjacent to the first pixel so that the area of the first pixel becomes greater than the area of the second pixel.

19. The liquid crystal display device of claim 18, wherein the drain electrode is formed in the first pixel but is not formed in the second pixel so that an opening area of the first pixel is smaller than an opening of the second pixel.

20. The liquid crystal display device of claim 10, wherein the pixel electrode comprises a first pixel electrode in the first pixel and a second pixel electrode in the second pixel, the first pixel electrode is connected with a first drain electrode and the second pixel electrode is connected with a second drain electrode, and the first drain electrode and the second drain electrode is provided in the same first pixel.

* * * * *